United States Patent
Pelella et al.

(10) Patent No.: US 6,700,430 B1
(45) Date of Patent: Mar. 2, 2004

(54) METHOD TO REDUCE TIME TO DYNAMIC STEADY-STATE CONDITION

(75) Inventors: Mario M. Pelella, Mountain View, CA (US); Srikanth Sundararajan, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/188,173

(22) Filed: Aug. 20, 2002

(51) Int. Cl.⁷ .............................................. H03K 17/04
(52) U.S. Cl. ....................................... 327/374; 327/198
(58) Field of Search .................................. 327/374, 142, 327/143, 198, 263, 362; 323/901

(56) References Cited

U.S. PATENT DOCUMENTS 5,514,951 A * 5/1996 Halim et al. ................. 323/901
6,492,848 B1 * 12/2002 Lee ............................. 327/143

OTHER PUBLICATIONS

Pelella, M.M. et al., Analysis and Contol of Hysteresis in PD/SOI CMOS, IEDM, Washington, D.C., Dec. 1999.

* cited by examiner

Primary Examiner—Terry D. Cunningham
Assistant Examiner—Long Nguyen
(74) Attorney, Agent, or Firm—Winstead Sechrest & Minick P.C.

(57) ABSTRACT

A method for reducing the time for a partially depleted/silicon-on-insulator (PD/SOI) based circuit to reach a dynamic steady state pre-conditions the PD/SOI-based circuit by initially charging the circuit at a voltage greater than the normal operating voltage. The circuit is then charged at the normal operating voltage after a predetermined amount of time. By pre-conditioning the circuit in this manner, the amount of time required for the PD/SOI transistors of the circuit to reach their dynamic steady state (DSS) condition is shortened.

8 Claims, 6 Drawing Sheets

200

METHOD TO REDUCE TIME TO DYNAMIC STEADY-STATE CONDITION

FIELD OF THE INVENTION

The present invention relates to microprocessors, and more particularly to the powering of clock circuits in microprocessors.

BACKGROUND OF THE INVENTION

The user of partially depleted/silicon-on-insulator (PD/SOI) transistors is known in the industry. One use is in circuits of a microprocessor. FIG. 1 illustrates a conventional microprocessor. The microprocessor 100 comprises a clock circuit 104 and a power supply and control 102 for the clock circuit 104. The power supply 102 also powers other circuits on the microprocessor, such as low duty cycle circuits 106. The power supply and control 102 can be off-chip as well.

FIG. 2 illustrates a conventional inverter circuit utilizing PD/SOI transistors. The inverter circuit 200 is a basic building block for higher-order circuits of the microprocessor 100, including the clock circuit 104 and the low duty cycle circuits 106. The inverter circuit 200 comprises a PD/SOI n-channel metal oxide semiconductor field effect transistor (MOSFET) 202 and a PD/SOI p-channel MOSFET 204, coupled as shown. The inverter circuit 200 is powered with a voltage $V_{DD}$.

FIG. 3 illustrates a cross-sectional view of a PD/SOI transistor. The transistor 300 comprises a substrate 314. Formed in the substrate is a source 302, a drain 304, and a floating body region 310 between the source 302 and drain 304. Above the source 302, drain 304, and body region 310 are a gate 306 and an insulator layer 308. The insulator layer 308 can be oxide, nitride, a combination of oxide and nitride, or some other insulating material. Another insulator layer 312 resides between the floating body 310 and the rest of the substrate 314, isolating the body 310. When the transistor 300 is charged after being dormant for a significant amount of time, excess charge builds within the floating body 310 due to slow carrier recombination/generation processes. As the excess charge builds, the threshold voltage of the transistor 300 is lowered and varies over time.

In the context of the inverter circuit 200, a normal operating voltage $V_{DD}$ is applied to the inverter circuit 200. Excess charge builds up in the body 310 during this initial voltage application. The excess charge lowers and varies the threshold voltage of the inverter circuit's transistors 202 and 204 over time, which in turn causes the switching delay of the inverter circuit 200 to vary over time. This variation is known in the industry as the "hysteresis" effect. Eventually, the transistors 202 and 204 of the inverter circuit 200 stabilize to their dynamic steady state (DSS) conditions.

When the inverter circuit 200 is used for the clock circuit 104, the hysteresis effect causes the timing of both the rise and fall of each clock cycle to vary. Thus, while the hysteresis effect persists, reliability of transmitted data could be compromised. Typically, data transmission is delayed until the transistors 202 and 204 of the invert circuit 200 reach their DSS condition, stabilizing the clock cycles. However, the time required for this could be lengthy, such as for several microseconds.

Accordingly, there exists a need for a method for reducing the time for a PD/SOI-based circuit to reach a dynamic steady state. The present invention addresses such a need.

SUMMARY OF THE INVENTION

A method for reducing the time for a partially depleted/silicon-on-insulator (PD/SOI) based circuit to reach a dynamic steady state pre-conditions the PD/SOI-based circuit by initially charging the circuit at a voltage greater than the normal operating voltage. The circuit is then charged at the normal operating voltage after a predetermined amount of time. By pre-conditioning the circuit in this manner, the amount of time required for the PD/SOI transistors of the circuit to reach their dynamic steady state (DSS) condition is shortened.

DETAILED DESCRIPTION

The present invention provides a method for reducing the time for a PD/SOI-based circuit to reach a dynamic steady state. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention pre-conditions a partially depleted/silicon-on-insulator (PD/SOI) based circuit of a microprocessor by initially charging the circuit at a voltage greater than the normal operating voltage. The circuit is then charged at the normal operating voltage after a predetermined amount of time. By pre-conditioning the circuit in this manner, the amount of time required for the PD/SOI transistors of the circuit to reach their dynamic steady state (DSS) condition is shortened.

To more particularly describe the features of the present invention, please refer to FIGS. 4 through 6 in conjunction with the discussion below.

Figure 1:
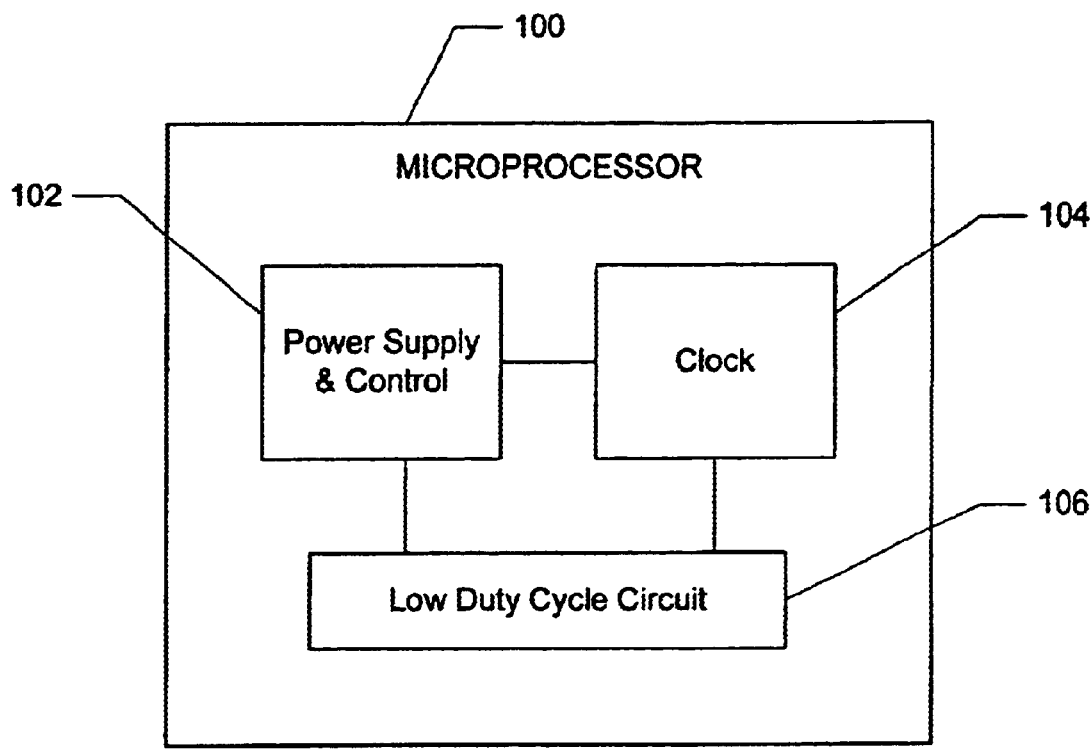
FIG. 1 illustrates a conventional microprocessor.
Figure 2:
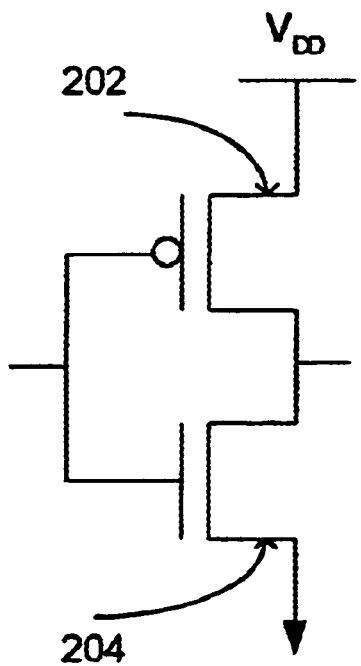
FIG. 2 illustrates a conventional inverter circuit utilizing PD/SOI transistors.
Figure 3:
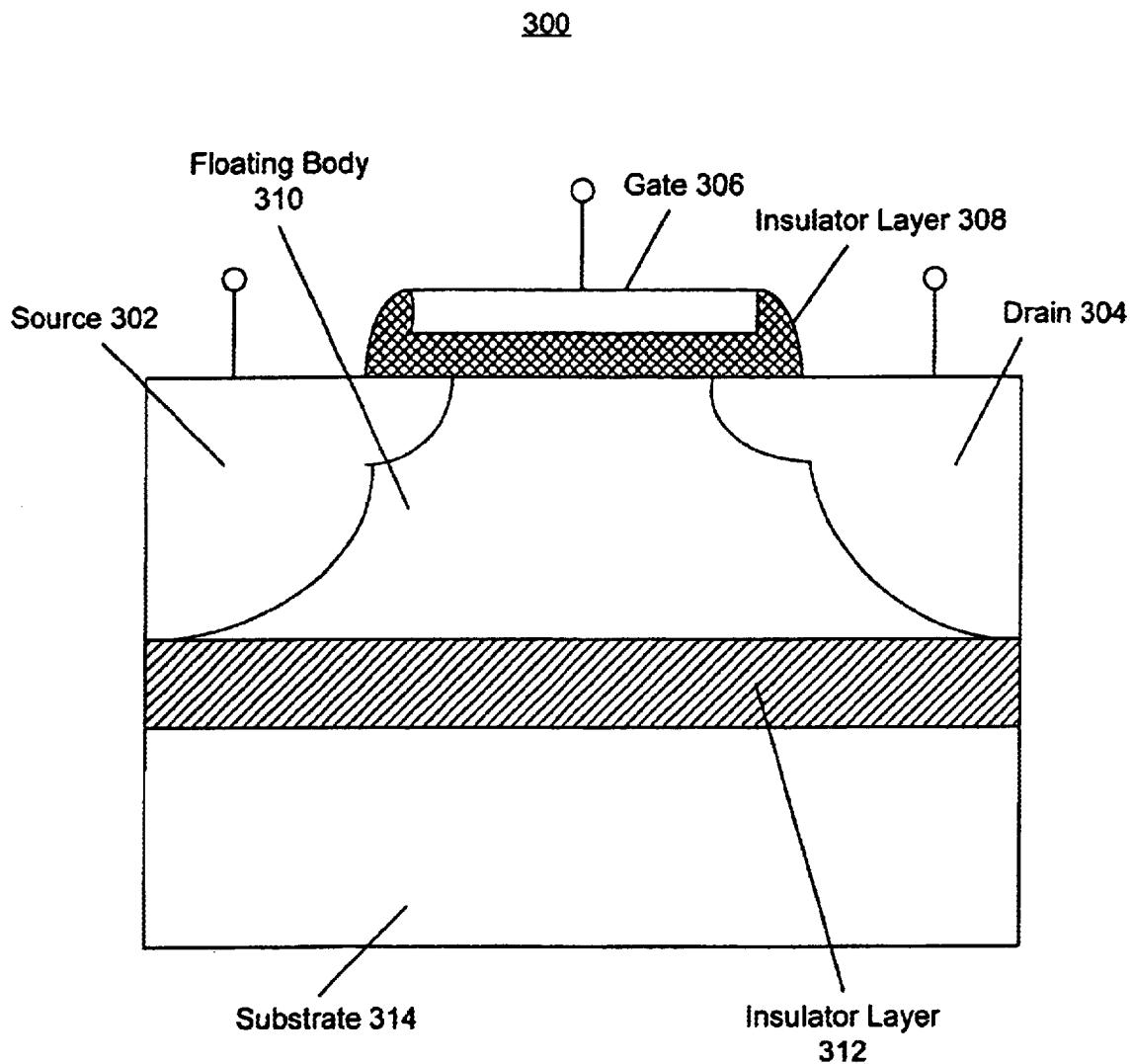
FIG. 3 illustrates a cross-sectional view of a PD/SOI transistor.
Figure 4:
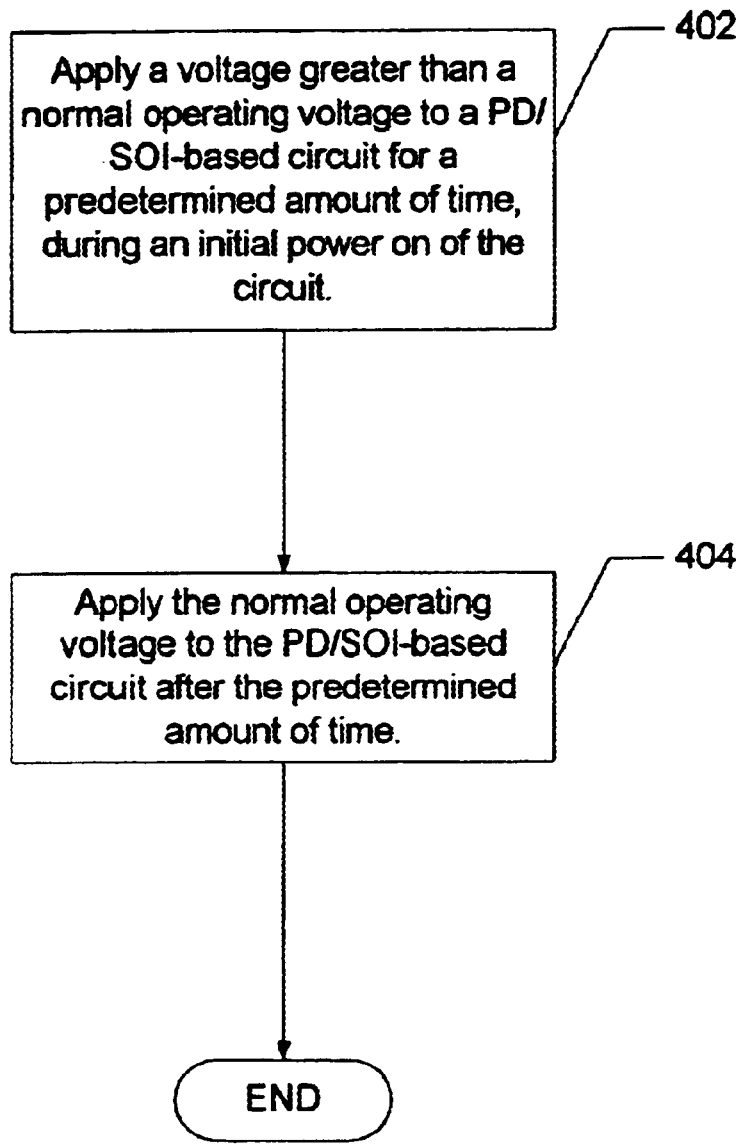
FIG. 4 is a flowchart illustrating a preferred embodiment of the method for reducing the time for a PD/SOI-based circuit to reach a dynamic steady state in accordance with the present invention.

FIG. 4 is a flowchart illustrating a preferred embodiment of the method for reducing the time for a PD/SOI-based circuit to reach a dynamic steady state in accordance with the present invention. First, a voltage greater than a normal operating voltage is applied to a PD/SOI-based circuit for a predetermined amount of time, via step 402, during an initial power on of the circuit. Then, the normal operating voltage is applied to the PD/SOI-based circuit after the predetermined amount of time, via step 404.

For the microprocessor 100, assume that $V_{DD}$ is the normal operating voltage of the PD-SOI-based clock circuit 104. First, a power on reset is initiated for the microprocessor 100. Then, a voltage greater than $V_{DD}$ is applied to the clock circuit 104 for a predetermined amount of time, via step 402. After the predetermined amount of time, the voltage applied to the clock circuit 104 is lowered to $V_{DD}$, via step 404.

Because the clock circuit 104 is pre-conditioned by the application of the greater voltage, the excess charge in the floating body 310 of the PD/SOI transistors of the clock circuit 104 builds up faster than if the clock circuit 104 was not pre-conditioned. This causes the threshold voltage of the PD/SOI transistors to lower at a faster rate, causing the switching states of the clock circuit 104 to vary at a faster rate, which in turn causes the PD/SOI transistors to reach their DSS condition at a faster rate. In this manner, the clock cycles become consistent sooner than if the clock circuit 104 was not pre-conditioned according to the present invention. The wait time for the clock cycles to stabilize so that data can be reliably transmitted is significantly shortened.

Figure 5A:
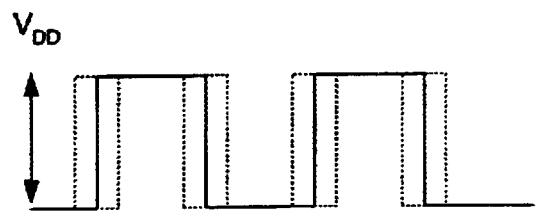
FIGS. 5A–5B are clock timing diagrams illustrating the method for reducing the time for a PD/SOI-based circuit to reach a dynamic steady state in accordance with the present invention.
Figure 5B:
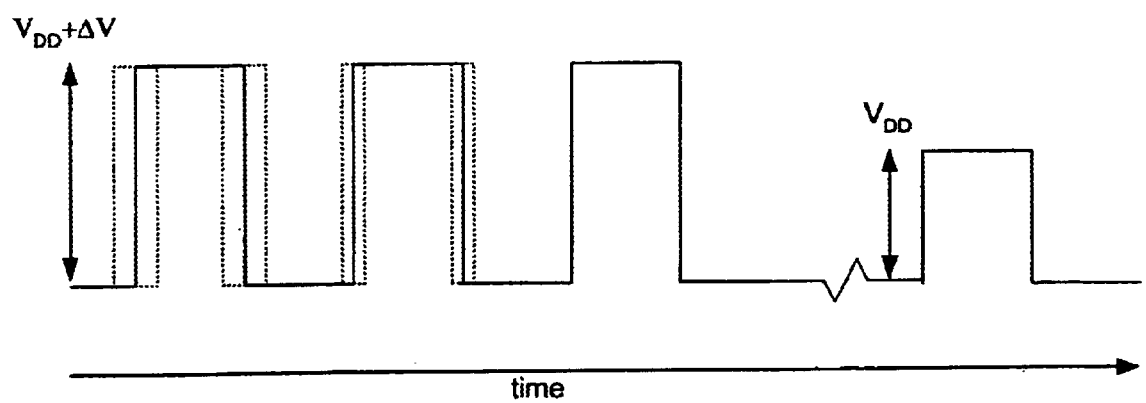

FIGS. 5A–5B are clock timing diagrams illustrating the method for reducing the time for a PD/SOI-based circuit to reach a dynamic steady state in accordance with the present invention. FIG. 5A illustrates a clock timing diagram for the clock circuit 104 charged at $V_{DD}$ only. FIG. 5B illustrates a clock timing diagram for the clock circuit 104 pre-conditioned at a voltage greater than $V_{DD}$. In FIG. 5A, $V_{DD}$ is applied to the clock circuit 104 from the beginning of the initial power on. The switching states for each clock cycle vary over time due to the hysteresis effect, as illustrated by the dotted lines.

In FIG. 5B, the clock circuit 104 is first charged with a voltage of $V_{DD}+\Delta V$, which is greater than $V_{DD}$, via step 402. If $V_{DD}$ is a positive voltage, then $\Delta V$ is also a positive voltage. If $V_{DD}$ is a negative voltage, then $\Delta V$ is also a negative voltage. The greater voltage is applied to the clock circuit 104 for a predetermined amount of time. Afterwards, $V_{DD}$ is applied to the clock circuit 104, via step 404. As illustrated by the dotted lines in FIG. 5B, the switching states of the clock circuit 104 vary at a faster rate, which in turn causes the PD/SOI transistors of the clock circuit 104 to reach their DSS condition at a faster rate.

Figure 6:
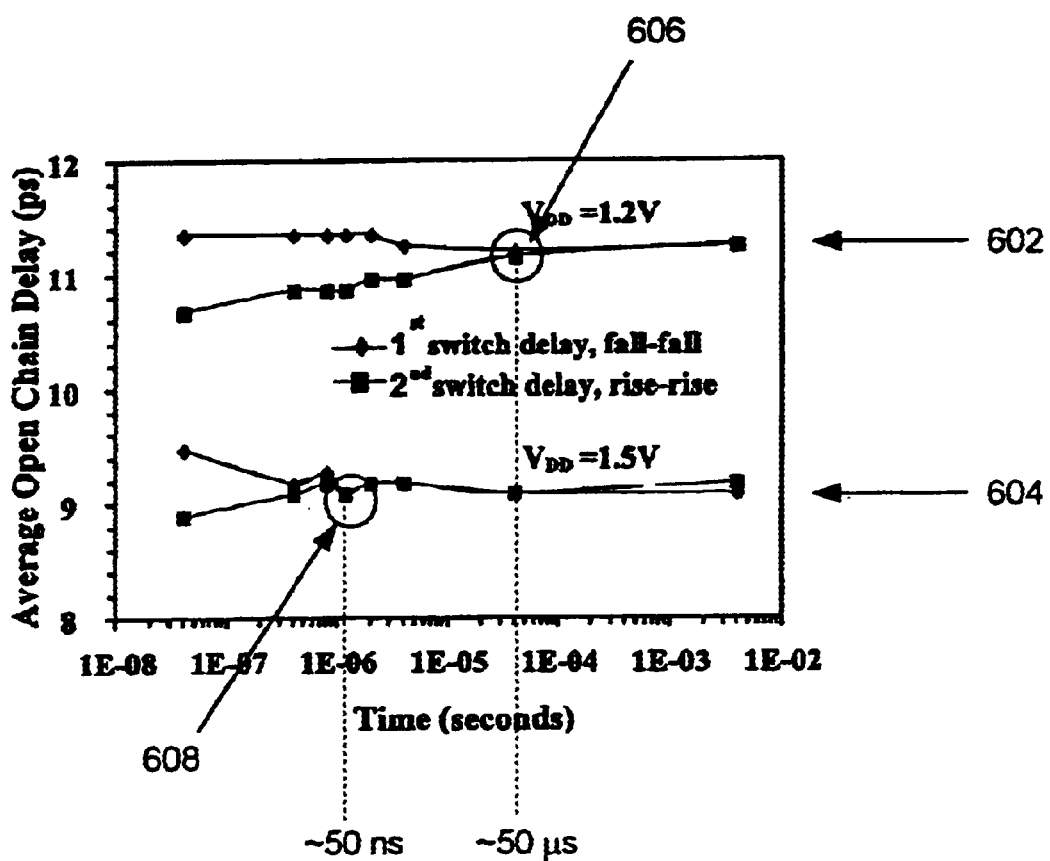
FIG. 6 is a graph illustrating example data measurements for the method for reducing the time for a PD/SOI-based circuit to reach a dynamic steady state in accordance with the present invention.

FIG. 6 is a graph illustrating example data measurements for the method for reducing the time for a PD/SOI-based circuit to reach a dynamic steady state in accordance with the present invention. The illustrated measurements were taken from an open chain delay circuit comprising a series of the inverter circuits 200. The top graph 602 illustrates example data measurements of the average open chain delay versus time when $V_{DD}$ only is applied to the open chain delay circuit. The time 606 at which the circuit reaches the DSS condition is approximately 50 µs. The bottom graph 604 illustrates example data measurements of the average open chain delay versus time when the circuit is charged at $V_{DD}+\Delta V$ for a predetermined amount of time, and then charged at $V_{DD}$ afterwards. The time 608 at which the circuit reaches the DSS condition is approximately 50ns. Thus, a circuit charged in accordance with the present invention reaches the DSS condition at a significantly lesser amount of time than if the circuit was charged only at the normal operating voltage $V_{DD}$.

Although the present invention is described above with reference to a clock circuit, other PD/SOI-based circuits, such as the low duty cycle circuit 106 of the microprocessor 100 may also be charged in accordance with the present invention.

A method for reducing the time for a partially depleted/silicon-on-insulator (PD/SOI) based circuit to reach a dynamic steady state has been disclosed. The method pre-conditions the PD/SOI-based circuit by initially charging the circuit at a voltage greater than the normal operating voltage. The circuit is then charged at the normal operating voltage after a predetermined amount of time. By pre-conditioning the circuit in this manner, the amount of time required for the PD/SOI transistors of the circuit to reach their dynamic steady state (DSS) condition is shortened.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reducing the time for a partially depleted/silicon-on-insulator (PD/SOI) based circuit to reach a dynamic steady state, comprising the steps of:

(a) applying a voltage greater than a normal operating voltage to the PD/SOI-based circuit for a predetermined amount of time, during an initial power on of the PD/SOI-based circuit; and (b) applying the normal operating voltage to the PD/SOI-based circuit after the predetermined amount of time.

2. The method of claim 1, wherein the applying step (a) comprises:

(a1) initiating a power on reset of a microprocessor, wherein the microprocessor comprises a PD/SOI-based clock circuit; and (a2) applying the voltage greater than the normal operating voltage to the PD/SOI-based clock circuit for the predetermined amount of time.

3. The method of claim 2, wherein the applying step (b) comprises:

(b1) applying the normal operating voltage to the PD/SOI-based clock circuit after the predetermined amount of time.

4. The method of claim 1, wherein a wait time for the PD/SOI-based circuit to reach the dynamic steady state is shorter than if the normal operating voltage was applied to the PD/SOI-based circuit during the predetermined amount of time.

5. A method for reducing the time for a PD/SOI based clock circuit to reach a dynamic steady state, comprising the steps of:

(a) initiating a power on reset of a microprocessor, wherein the microprocessor comprises the PD/SOI-based clock circuit;

(b) applying a voltage greater than the normal operating voltage to the PD/SOI-based clock circuit for a predetermined amount of time; and (c) applying the normal operating voltage to the PD/SOI-based clock circuit after the predetermined amount of time.

6. A system, comprising:

a power supply; and a PD/SOI-based circuit, wherein a voltage greater than a normal operating voltage is applied to the PD/SOI-based circuit by the power supply for a predetermined amount of time, wherein the normal operating voltage is applied to the PD/SOI-based circuit by the power supply after the predetermined amount of time.

7. The system of claim 6, wherein the PD/SOI-based circuit comprises a clock circuit.

8. The system of claim 6, wherein a wait time for the PD/SOI-based circuit to reach a dynamic steady state is shorter than if the normal operating voltage was applied to the PD/SOI-based circuit during the predetermined amount of time.

* * * * *

UNITED STATES PATENT AND TRADEMARK OFFICE
CERTIFICATE OF CORRECTION

PATENT NO. : 6,700,430 B1  
DATED : March 2, 2004  
INVENTOR(S) : Mario M. Pelella, Srikanth Sundararajan It is certified that error appears in the above-identified patent and that said Letters Patent is hereby corrected as shown below:

<u>Title page,</u>
Item [22], PCT Filed, please replace "(22) Filed: August 20, 2002" with -- (22) Filed: July 1, 2002 --

Signed and Sealed this

Twenty-fifth Day of May, 2004

JON W. DUDAS  
*Acting Director of the United States Patent and Trademark Office*